United States Patent
Arifuku et al.

(10) Patent No.: US 8,132,319 B2
(45) Date of Patent: Mar. 13, 2012

(54) CIRCUIT CONNECTING METHOD

(75) Inventors: Motohiro Arifuku, Ibaraki (JP);
Kazuyoshi Kojima, Ibaraki (JP); Kouji Kobayashi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/740,801

(22) PCT Filed: Feb. 6, 2008

(86) PCT No.: PCT/JP2008/051960
§ 371 (c)(1),
(2), (4) Date: Apr. 30, 2010

(87) PCT Pub. No.: WO2009/057332
PCT Pub. Date: May 7, 2009

(65) Prior Publication Data
US 2010/0263208 A1    Oct. 21, 2010

(30) Foreign Application Priority Data

Oct. 30, 2007    (JP) ............................... P2007-281611

(51) Int. Cl.
*H05K 3/30* (2006.01)
(52) U.S. Cl. ............................... 29/832; 29/830; 29/840
(58) Field of Classification Search ............. 29/830, 29/832, 846, 825, 840
See application file for complete search history.

(56) References Cited

U.S. PATENT DOCUMENTS

| | | | | |
|---|---|---|---|---|
| 4,554,033 A | * | 11/1985 | Dery et al. | 156/52 |
| 5,084,961 A | * | 2/1992 | Yoshikawa | 29/840 |
| 5,235,741 A | * | 8/1993 | Mase | 29/830 |
| 5,375,003 A | * | 12/1994 | Hirai | 349/187 |
| 5,502,889 A | * | 4/1996 | Casson et al. | 29/830 |
| 5,799,392 A | * | 9/1998 | Mishiro | 29/830 |
| 5,839,188 A | * | 11/1998 | Pommer | 29/830 |

(Continued)

FOREIGN PATENT DOCUMENTS

EP    0 893 484 A2    1/1999
(Continued)

OTHER PUBLICATIONS

Office Action issued on Jan. 5, 2011 in a counterpart Chinese application No. 20080011307.4.

(Continued)

*Primary Examiner* — Carl Arbes
(74) *Attorney, Agent, or Firm* — Griffin & Szipl, P.C.

(57) ABSTRACT

The invention provides a circuit connecting method that can satisfactorily reduce connection resistance between circuit electrodes electrically connected via an anisotropic conductive film for circuit connection.

The circuit connecting method comprises a step of preparing a circuit member 12 having circuit electrodes 12b formed on a glass substrate 12a, a step of preparing a flexible wiring board 14 having circuit electrodes 14b formed on a base 14a and provided with a solder resist 18 at the sections of the circuit electrodes 14b other than the sections that are connected to the circuit electrodes 12b, and a step of bonding the circuit member 12 to the flexible wiring board 14 via an anisotropic conductive film for circuit connection 16 so that part of the anisotropic conductive film for circuit connection 16 overlaps with part of the solder resist 18. The thickness h3 of the anisotropic conductive film for circuit connection 16 is no greater than the total of the height h1 of the circuit electrodes 12b and the height h2 of the circuit electrodes 14b.

12 Claims, 4 Drawing Sheets

U.S. PATENT DOCUMENTS

| | | |
|---|---|---|
| 5,903,056 A | 5/1999 | Canning et al. |
| 2002/0060092 A1 | 5/2002 | Kumakura |
| 2002/0135727 A1 | 9/2002 | Nakaminami et al. |
| 2005/0286240 A1 | 12/2005 | Sakamoto et al. |
| 2007/0242207 A1 | 10/2007 | Fujita |

FOREIGN PATENT DOCUMENTS

| | | |
|---|---|---|
| JP | 05-303107 | 11/1993 |
| JP | 11-148058 | 6/1999 |
| JP | 11-288750 | 10/1999 |
| JP | 2002-358026 | 12/2002 |
| JP | 2005-235956 A | 9/2005 |
| JP | 2005-310905 | 11/2005 |
| TW | 1265190 | 11/2006 |

OTHER PUBLICATIONS

Search report completed on Jan. 27, 2011 and mailed on Feb. 4, 2011 in a counterpart European application 08710856.9.

International Search Report issued in corresponding application No. PCT/JP2008/051960, completed Apr. 30, 2008 and mailed May 13, 2008.

Office Action issued on May 23, 2011 and mailed May 31, 2011 in a counterpart Japanese Application No. P2009-538956.

Office Action issued on Dec. 13, 2011 in a counterpart Taiwanese application 097104907 (no translation available, submitted for certification).

* cited by examiner

| | h1 + h2 [μm] | h3 [μm] | Sandwiching conditions | Connection resistance [Ω] | Insulation resistance [Ω] |
|---|---|---|---|---|---|
| Example 1-1 | 8.05 | 8 | 180°C, 3MPa, 15sec | 32.4 | $7.00 \times 10^9$ |
| Example 1-2 | 8.05 | 8 | 210°C, 3MPa, 15sec | 32.7 | $7.00 \times 10^9$ |
| Example 2-1 | 8.05 | 6 | 180°C, 3MPa, 15sec | 31.1 | $2.00 \times 10^{10}$ |
| Example 2-2 | 8.05 | 6 | 210°C, 3MPa, 15sec | 31.3 | $6.00 \times 10^9$ |
| Example 3-1 | 8.05 | 8 | 180°C, 3MPa, 5sec | 30.1 | $5.00 \times 10^9$ |
| Example 3-2 | 8.05 | 8 | 210°C, 3MPa, 5sec | 31.2 | $9.00 \times 10^9$ |
| Example 4-1 | 8.05 | 6 | 180°C, 3MPa, 5sec | 29.4 | $7.00 \times 10^9$ |
| Example 4-2 | 8.05 | 6 | 210°C, 3MPa, 5sec | 29.7 | $4.00 \times 10^9$ |
| Example 5-1 | 12.05 | 12 | 180°C, 3MPa, 15sec | 27.5 | $9.00 \times 10^8$ |
| Example 5-2 | 12.05 | 12 | 210°C, 3MPa, 15sec | 28.1 | $4.00 \times 10^9$ |
| Example 6-1 | 12.05 | 8 | 180°C, 3MPa, 15sec | 26.2 | $3.00 \times 10^9$ |
| Example 6-2 | 12.05 | 8 | 210°C, 3MPa, 15sec | 26.7 | $1.00 \times 10^{10}$ |
| Example 7-1 | 12.05 | 12 | 180°C, 3MPa, 5sec | 26.3 | $6.00 \times 10^9$ |
| Example 7-2 | 12.05 | 12 | 210°C, 3MPa, 5sec | 26.5 | $3.00 \times 10^9$ |
| Example 8-1 | 12.05 | 8 | 180°C, 3MPa, 5sec | 25.1 | $1.00 \times 10^9$ |
| Example 8-2 | 12.05 | 8 | 210°C, 3MPa, 5sec | 25.6 | $6.00 \times 10^9$ |
| Example 9-1 | 8.05 | 3 | 180°C, 3MPa, 15sec | 30.3 | $5.00 \times 10^5$ |
| Example 9-2 | 8.05 | 3 | 210°C, 3MPa, 15sec | 30.5 | $7.00 \times 10^5$ |
| Example 10-1 | 8.05 | 3 | 180°C, 3MPa, 5sec | 29.2 | $4.00 \times 10^4$ |
| Example 10-2 | 8.05 | 3 | 210°C, 3MPa, 5sec | 29.4 | $5.00 \times 10^5$ |
| Example 11-1 | 8.05 | 4 | 180°C, 3MPa, 15sec | 25.3 | $1.00 \times 10^5$ |
| Example 11-2 | 8.05 | 4 | 210°C, 3MPa, 15sec | 25.5 | $4.00 \times 10^4$ |
| Example 12-1 | 8.05 | 4 | 180°C, 3MPa, 5sec | 24.2 | $3.00 \times 10^5$ |
| Example 12-2 | 8.05 | 4 | 210°C, 3MPa, 5sec | 24.4 | $2.00 \times 10^4$ |
| Comp. Ex. 1-1 | 8.05 | 12 | 180°C, 3MPa, 15sec | 38.4 | $7.00 \times 10^9$ |
| Comp. Ex. 1-2 | 8.05 | 12 | 210°C, 3MPa, 15sec | 39.9 | $3.00 \times 10^9$ |
| Comp. Ex. 2-1 | 8.05 | 12 | 180°C, 3MPa, 5sec | 42.9 | $8.00 \times 10^8$ |
| Comp. Ex. 2-2 | 8.05 | 12 | 210°C, 3MPa, 5sec | 46.7 | $1.00 \times 10^9$ |
| Comp. Ex. 3-1 | 8.05 | 14 | 180°C, 3MPa, 15sec | 34.7 | $1.00 \times 10^{10}$ |
| Comp. Ex. 3-2 | 8.05 | 14 | 210°C, 3MPa, 15sec | 35 | $1.00 \times 10^9$ |
| Comp. Ex. 4-1 | 8.05 | 14 | 180°C, 3MPa, 5sec | 35.2 | $8.00 \times 10^9$ |
| Comp. Ex. 4-2 | 8.05 | 14 | 210°C, 3MPa, 5sec | 37.3 | $4.00 \times 10^9$ |

CIRCUIT CONNECTING METHOD

This is a National Phase Application in the United States of International Patent Application No. PCT/JP2008/051960 filed Feb. 6, 2008, which claims priority on Japanese Patent Application No. P2007-281611, filed Oct. 30, 2007. The entire disclosures of the above patent applications are hereby incorporated by reference.

TECHNICAL FIELD

The present invention relates to a circuit connecting method.

BACKGROUND ART

As circuit electrode widths and circuit electrode spacings have become extremely narrow with increasingly higher densities of circuits used in the field of precision electronic devices in recent years, circuit-bonding methods for such circuits have been desired that have reliability equivalent or superior to conventional reliability.

With circuit bonding, incidentally, and particularly with bonding of circuit electrodes formed on flexible wiring boards to circuit electrodes formed on other circuit members, folding of the flexible wiring boards has posed the risk of cracking the circuits on the flexible board, thus causing wire breakage. Circuit-bonding methods have therefore been developed wherein, on a flexible board with circuit bonded sections that are bonded using an anisotropic conductive film for circuit connection, a circuit-protecting member (solder resist) is provided at the sections of circuit electrodes outside of the circuit-bonded sections to protect those sections, and during circuit bonding between circuit electrodes on the flexible board and circuit electrodes on a glass substrate with an anisotropic conductive film for circuit connection, the anisotropic conductive film for circuit connection is also attached to a part of the circuit-protecting member in addition to the circuit-bonded sections (see Patent document 1, for example). According to this circuit-bonding method, the circuit electrodes on the flexible board are protected by the circuit-protecting member and anisotropic conductive film for circuit connection, thus helping to prevent wire breakage of the circuit electrodes on the flexible board and producing high bonding strength between the circuit electrodes.

[Patent document 1] Japanese Unexamined Patent Publication No. 2002-358026

DISCLOSURE OF THE INVENTION

Problems to be Solved by the Invention

In the conventional circuit-bonding method described above, however, the circuit-protecting member and anisotropic conductive film for circuit connection overlap during circuit bonding between the circuit electrodes on the flexible board and the circuit electrodes on the glass substrate with an anisotropic conductive film for circuit connection, and therefore the anisotropic conductive film for circuit connection present near the circuit-protecting member is not easily eliminated between the circuit electrodes that are adjacent to each other, and the connection resistance between the circuit electrodes that are electrically connected by the anisotropic conductive film for circuit connection is increased.

It is an object of the present invention to provide a circuit connecting method that can sufficiently reduce connection resistance between circuit electrodes that are electrically connected via an anisotropic conductive film for circuit connection, even when a part of the circuit-protecting member is bonded with the anisotropic conductive film for circuit connection in addition to the circuit-bonded sections of the circuit electrodes.

Means for Solving the Problems

The circuit connecting method of the invention comprises a step of preparing a first circuit member having first circuit electrodes formed on the main surface of a first board, a step of preparing a second circuit member having second circuit electrodes formed on the main surface of a second board, with an insulating layer provided on the sections of the second circuit electrodes other that the sections that are connected to the first circuit electrodes and a step of bonding the first circuit member and second circuit member via an anisotropic conductive film for circuit connection so that part of the anisotropic conductive film for circuit connection overlaps part of the insulating layer, for electrical connection between the first circuit electrodes and second circuit electrodes, wherein the thickness of the anisotropic conductive film for circuit connection is no greater than the total of the height of the first circuit electrodes and the height of the second circuit electrodes.

In the circuit connecting method of the invention, the first circuit member and second circuit member are bonded via the anisotropic conductive film for circuit connection, and the thickness of the anisotropic conductive film for circuit connection is no greater than the total of the height of the first circuit electrodes and the height of the second circuit electrodes. When the first circuit member and second circuit member are bonded, therefore, the part of the anisotropic conductive film for circuit connection between the first circuit electrodes and second circuit electrodes remain between the first circuit electrodes and second circuit electrodes only in the amount required to electrically connect and bond the first circuit electrodes and second circuit electrodes, while the rest is eliminated between the adjacent electrodes among the first circuit electrodes and the adjacent electrodes among the second circuit electrodes. As a result, even if the first circuit member and second circuit member are bonded via the anisotropic conductive film for circuit connection so that part of the anisotropic conductive film for circuit connection overlaps a part of the insulating layer, it is possible to sufficiently reduce the connection resistance between the first circuit electrodes and second circuit electrodes that are electrically connected via the anisotropic conductive film for circuit connection. If the thickness of the anisotropic conductive film for circuit connection is greater than the total of the height of the first circuit electrodes and the height of the second circuit electrodes, the part of the anisotropic conductive film for circuit connection between the first circuit electrodes and second circuit electrodes will not be easily eliminated between the adjacent electrodes among the first circuit electrodes and the adjacent electrodes among the second circuit electrodes.

Preferably, the thickness of the anisotropic conductive film for circuit connection is no greater than 70% of the total of the height of the first circuit electrodes and the height of the second circuit electrodes. This will further promote elimination of the part of the anisotropic conductive film for circuit connection between the first circuit electrodes and second circuit electrodes, for between the adjacent electrodes among the first circuit electrodes and the adjacent electrodes among the second circuit electrodes.

Preferably, the thickness of the anisotropic conductive film for circuit connection is at least 50% of the total of the height of the first circuit electrodes and the height of the second circuit electrodes. If the thickness of the anisotropic conductive film for circuit connection is less than 50% of the total of the height of the first circuit electrodes and the height of the second circuit electrodes, the anisotropic conductive film for circuit connection will not sufficiently fill between the adjacent electrodes among the first circuit electrodes and the adjacent electrodes among the second circuit electrodes, thus lowering the bonding strength between the first circuit member and second circuit member while also tending to reduce the electrical insulating property between the adjacent electrodes among the first circuit electrodes and the electrical insulating property between the adjacent electrodes among the second circuit electrodes.

Preferably, at least one of the first circuit member and second circuit member is flexible wiring boards.

Also preferably, the first board material is glass and the second circuit member is a flexible wiring board.

Effect of the Invention

According to the invention it is possible to provide a circuit connecting method that can sufficiently reduce connection resistance between circuit electrodes that are electrically connected via an anisotropic conductive film for circuit connection, even when a part of the circuit-protecting member is bonded with the anisotropic conductive film for circuit connection in addition to the circuit-bonded sections of the circuit electrodes.

EXPLANATION OF SYMBOLS

10: Liquid crystal display device, 12: circuit member (first circuit member), 12a: first board, 12b: first circuit electrode, 14: flexible wiring board (second circuit member), 14a: second board, 14b: second circuit electrode, 16: anisotropic conductive film for circuit connection, 18: solder resist (insulating layer).

BEST MODE FOR CARRYING OUT THE INVENTION

Preferred embodiments of the invention will now be explained with reference to the accompanying drawings. Throughout the explanation, identical or similarly functioning elements will be referred to by like reference numerals and will be explained only once.

(Construction of Liquid Crystal Display Device)

Figure 1:
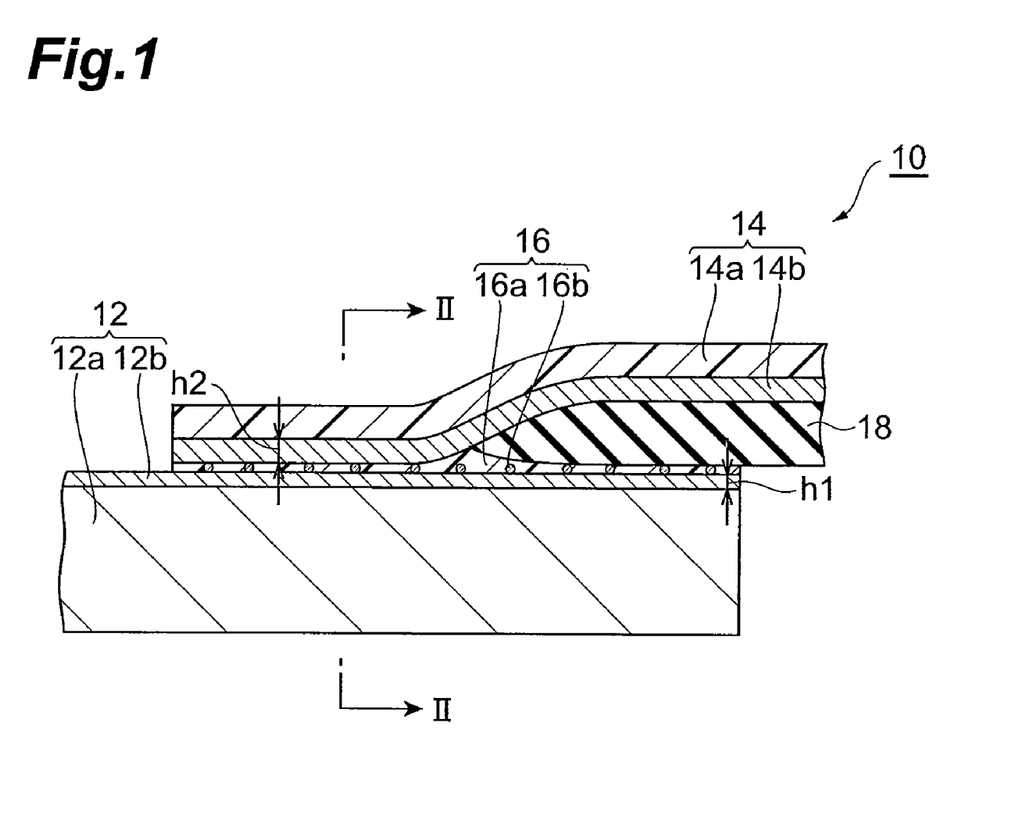
FIG. 1 is a cross-sectional view of a liquid crystal display device.

The construction of a liquid crystal display device 10 in which the circuit connecting method of the invention was applied will be explained first, with reference to FIG. 1 and FIG. 2. The liquid crystal display device 10 comprises a circuit member (first circuit member) 12, a flexible wiring board (second circuit member) 14, and an anisotropic conductive film for circuit connection 16.

The circuit member 12 comprises a glass substrate (first board) 12a and circuit electrodes (first circuit electrodes) 12b. The glass substrate 12a, together with another glass substrate (not shown), sandwiches the liquid crystal layer to form a liquid crystal panel.

The circuit electrodes 12b are a transparent electrode made of ITO (indium tin oxide), for example, and they are formed on the main surface of the glass substrate 12a. The circuit electrodes 12b have the function of applying a voltage to the liquid crystals in the liquid crystal layer to drive the liquid crystals. The height h1 of the circuit electrodes 12b may be about 0.05 µm-0.7 µm, for example.

The flexible wiring board 14 comprises a base (second board) 14a and circuit electrodes (second circuit electrodes) 14b. The base 14a may be a polyimide film, for example. The circuit electrodes 14b are composed of Cu with a Sn plating, for example, and they are formed on the main surface of the base 14a.

On the flexible wiring board 14, on the sections of the circuit electrodes 14b other than the section that is connected to the circuit electrodes 12b, there is provided a solder resist (insulating layer) 18 as a protecting member to protect the circuit electrodes 14b. The height h2 of the circuit electrodes 14b may be about 5 µm-100 µm, for example.

The anisotropic conductive film for circuit connection 16 has conductive particles 16b evenly dispersed in a thermosetting adhesive 16a. The anisotropic conductive film for circuit connection 16 has anisotropic conductivity such that it exhibits conductivity in the thickness direction in which force is applied, but exhibits no conductivity in the in-plane direction. The anisotropic conductive film for circuit connection 16 may be any adhesive film containing conductive particles 16b, without any particular restrictions, and using the thermosetting adhesive 16a as mentioned above results in a more notable effect of the invention with higher temperature and shorter time for the circuit connection conditions.

The anisotropic conductive film for circuit connection 16 bonds the circuit member 12 and flexible wiring board 14. Specifically, the anisotropic conductive film for circuit connection 16 is disposed between the circuit member 12 and part of the flexible wiring board 14 connected to the circuit member 12 and part of the solder resist 18, with a part of the anisotropic conductive film for circuit connection 16 overlapping a part of the solder resist 18.

Figure 2:
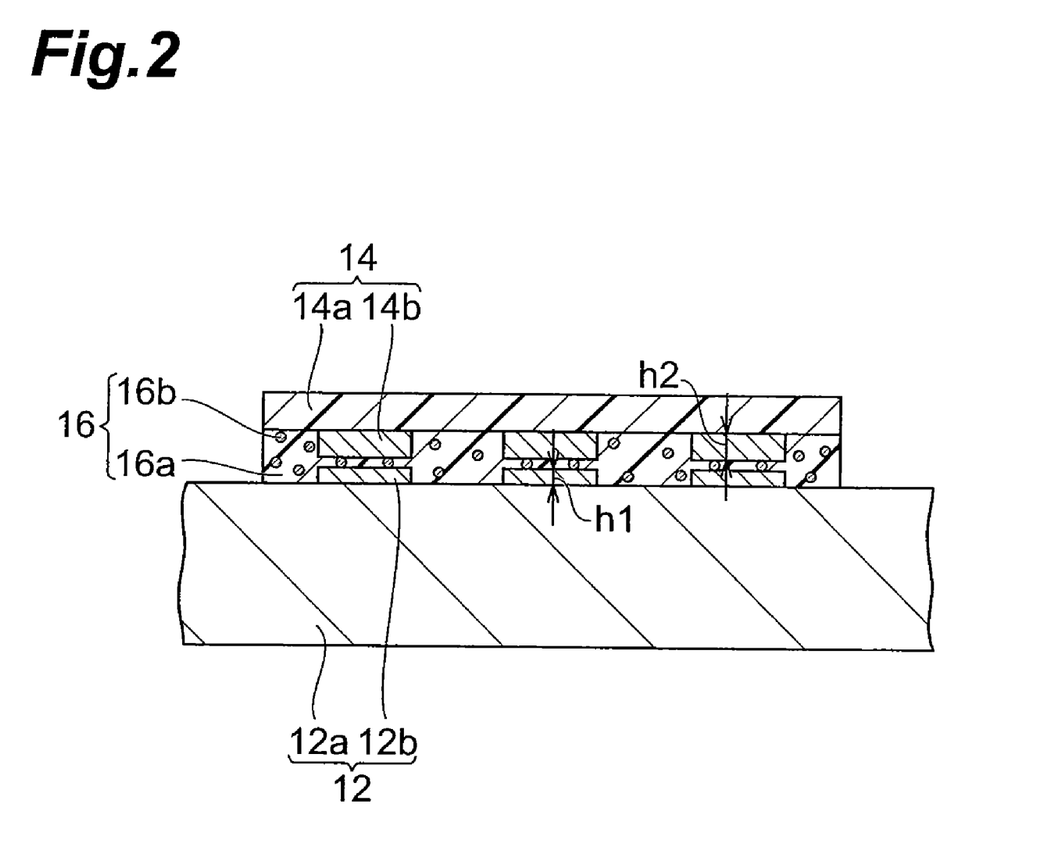
FIG. 2 is a cross-sectional view of FIG. 1 along line II-II.

As shown in detail in FIG. 2, the section of the anisotropic conductive film for circuit connection 16 other than the section that is between the circuit electrodes 12b and circuit electrodes 14b fills the area between the adjacent electrodes among each of the circuit electrodes 12b and the adjacent electrodes among each of the circuit electrodes 14b, so that the circuit electrodes 12b and circuit electrodes 14b become electrically connected by the conductive particles 16b.

(Method for Producing Liquid Crystal Display Device)

Figure 3:
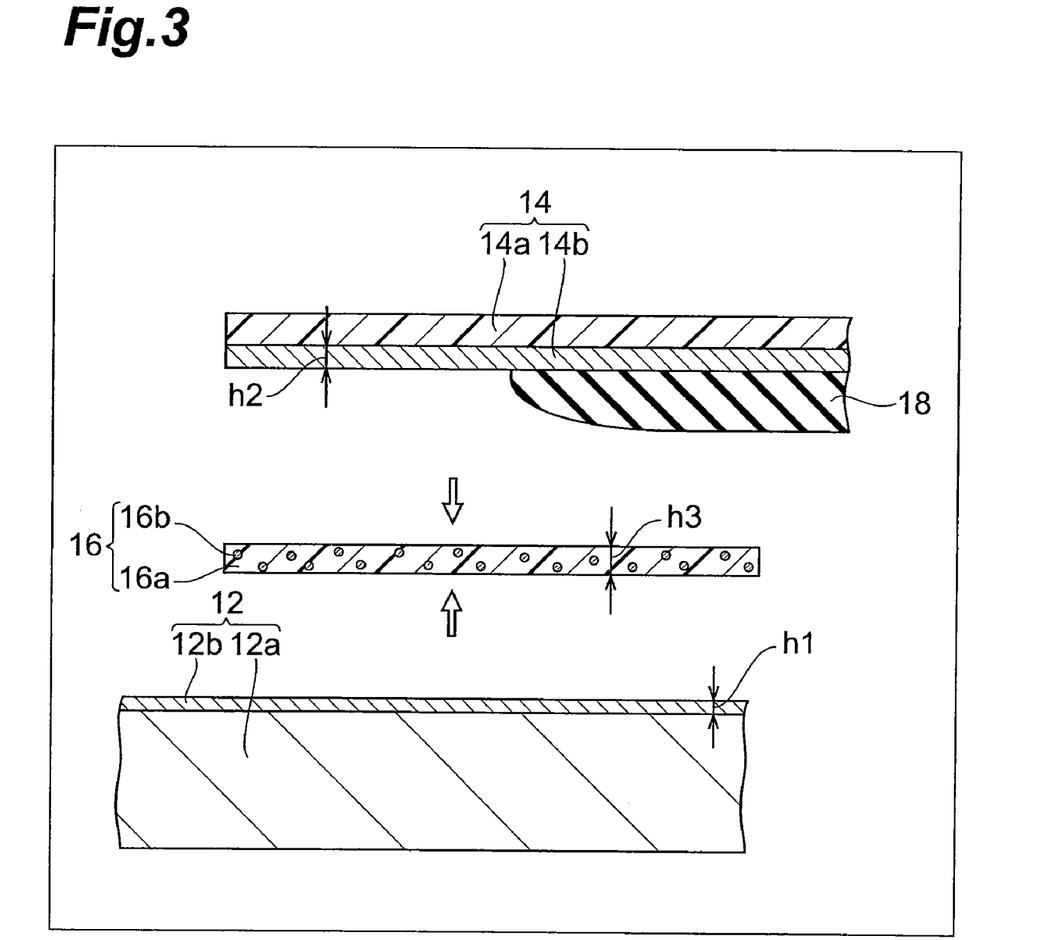
FIG. 3 is an illustration of a method for producing a liquid crystal display device.

A method for producing the liquid crystal display device 10 will now be explained with reference to FIG. 3.

First, a circuit member 12 (liquid crystal panel) having a circuit electrode 12b formed on the main surface of a glass substrate 12a is prepared. A flexible wiring board 14 is also prepared having circuit electrodes 14b formed on the main surface of a base 14a and having a solder resist 18 provided on the sections of the circuit electrodes 14b other than the section that are connected to the circuit electrodes 12b.

An anisotropic conductive film for circuit connection 16 is also prepared. The anisotropic conductive film for circuit connection 16 has a thickness h3 before connection of the circuit member 12 and flexible wiring board 14, which is no greater than the total of the height h1 of the circuit electrodes 12b and the height h2 of the circuit electrodes 14b, and it may be 5.05 µm-100.7 µm, for example.

The thickness h3 of the anisotropic conductive film for circuit connection 16 is preferably no greater than 70% of the total of the height h1 of the circuit electrodes 12b and the height h2 of the circuit electrodes 14b. This will further promote elimination of the part of the anisotropic conductive film for circuit connection 16 between the first circuit electrodes 12b and second circuit electrodes 14b, for between the adjacent electrodes among each of the first circuit electrodes 12b and the adjacent electrodes among each of the second circuit electrodes 14b.

Also, the thickness h3 of the anisotropic conductive film for circuit connection 16 is preferably at least 50% of the total of the height h1 of the circuit electrodes 12b and the height h2 of the circuit electrodes 14b. If the thickness h3 of the anisotropic conductive film for circuit connection 16 is less than 50% of the total of the height h1 of the first circuit electrodes 12b and the height h2 of the second circuit electrodes 14b, the anisotropic conductive film for circuit connection 16 will not sufficiently fill between the adjacent electrodes among each of the first circuit electrodes 12b and the adjacent electrodes among each of the second circuit electrodes 14b, thus lowering the bonding strength between the first circuit member 12b and second circuit member 14b while also tending to reduce the electrical insulating property between the adjacent electrodes among each of the first circuit electrodes 12b and the electrical insulating property between the adjacent electrodes among each of the second circuit electrodes 14b.

Next, the anisotropic conductive film for circuit connection 16 is disposed between the circuit member 12 and flexible wiring board 14, and the anisotropic conductive film for circuit connection 16 is sandwiched by the circuit member 12 and flexible wiring board 14 so that part of the anisotropic conductive film for circuit connection 16 overlaps with part of the solder resist 18. Specifically, the circuit member 12 and flexible wiring board 14 are bonded via the anisotropic conductive film for circuit connection 16 in this manner to complete the liquid crystal display device.

According to this embodiment, the circuit member 12 and flexible wiring board 14 are bonded via the anisotropic conductive film for circuit connection 16, and the thickness h3 of the anisotropic conductive film for circuit connection 16 is no greater than the total of the height h1 of the circuit electrodes 12b and the height h2 of the circuit electrodes 14b. Thus, when the circuit member 12 and flexible wiring board 14 are bonded, the part of the anisotropic conductive film for circuit connection 16 between the circuit electrodes 12b and circuit electrodes 14b remain between the circuit electrodes 12b and circuit electrodes 14b only in the amount required to electrically connect and bond the circuit electrodes 12b and circuit electrodes 14b, while the rest is eliminated between the adjacent electrodes among each of the circuit electrodes 12b and the adjacent electrodes among each of the circuit electrodes 14b. As a result, even if the circuit member 12 and flexible wiring board 14 are bonded via the anisotropic conductive film for circuit connection 16 so that part of the anisotropic conductive film for circuit connection 16 overlaps a part of the solder resist 18, it is possible to sufficiently reduce the connection resistance between the circuit electrodes 12b and circuit electrodes 14b that are electrically connected via the anisotropic conductive film for circuit connection 16.

The above detailed explanation of a preferred embodiment of the invention is not intended to restrict the scope of the invention to this particular embodiment. For example, the invention can also be applied to display devices other than liquid crystal display devices (such as plasma displays or organic EL displays).

Also, although the circuit member 12 (glass substrate 12a) and flexible wiring board 14 are bonded by the anisotropic conductive film for circuit connection 16 in this embodiment, two glass substrates may be bonded instead, or two flexible wiring boards may be bonded instead. Different circuit members other than these may also be bonded together.

EXAMPLES

The present invention will now be explained in greater detail based on Examples 1-1 to 12-2 and Comparative Examples 1-1 to 4-2, with the understanding that these examples are in no way limitative on the invention.

Example 1-1

First, a circuit member 12 was prepared having ITO circuit electrodes 12b (film thickness: h1=50 nm, surface resistance: <20Ω) formed on the surface of a glass substrate 12a (thickness: 1.1 mm). The line widths of the circuit electrodes 12b were 25 µm and the pitch was 50 µm.

There was also prepared a flexible wiring board 14 having Sn-plated Cu foil circuit electrodes 14b (thickness: h2=8 µm) formed on the surface of a polyimide film base 14a (thickness: 38 µm). The line widths of the circuit electrodes 14b were 18 µm and the pitch was 50 µm. Also, a solder resist 18 ("SN-9000" solder resist by Hitachi Chemical Co., Ltd.) was provided as a protecting member to protect the circuit electrodes 14b, on the sections of the circuit electrodes 14b other than the sections that are connected to the circuit electrodes 12b. The thickness of the solder resist 18 was 30 µm and the width was 10 mm.

There was additionally prepared an anisotropic conductive film for circuit connection 16 with a thickness h3 of 8 µm ("ANISOLM: AC-7206U-8" anisotropic conductive film by Hitachi Chemical Co., Ltd.).

The circuit member 12 and flexible wiring board 14 were positioned at a circuit bonding width of 1.5 mm and the anisotropic conductive film for circuit connection 16 was sandwiched by the circuit member 12 and flexible wiring board 14 and hot pressed at 180° C., 3 MPa for 15 seconds to obtain a liquid crystal display device 10 for Example 1-1. The anisotropic conductive film for circuit connection 16 and solder resist 18 had an overlap of 0.5 mm.

Example 1-2

A liquid crystal display device 10 for Example 1-2 was obtained in the same manner as Example 1-1, except that the anisotropic conductive film for circuit connection 16 was sandwiched by the circuit member 12 and flexible wiring board 14 and hot pressed at 210° C., 3 MPa for 15 seconds.

Example 2-1

A liquid crystal display device 10 for Example 2-1 was obtained in the same manner as Example 1-1, except that the anisotropic conductive film for circuit connection 16 had a thickness h3 of 6 µm ("ANISOLM: AC-7206U-6" anisotropic conductive film by Hitachi Chemical Co., Ltd.).

Example 2-2

A liquid crystal display device 10 for Example 2-2 was obtained in the same manner as Example 1-1, except that the anisotropic conductive film for circuit connection 16 had a thickness h3 of 6 μm ("ANISOLM: AC-7206U-6" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Example 3-1

A liquid crystal display device 10 for Example 3-1 was obtained in the same manner as Example 1-1, except that the anisotropic conductive film for circuit connection 16 had a thickness h3 of 8 μm ("ANISOLM: AC-11000Y-8" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 3-2

A liquid crystal display device 10 for Example 3-2 was obtained in the same manner as Example 1-1, except that the anisotropic conductive film for circuit connection 16 had a thickness h3 of 8 μm ("ANISOLM: AC-11000Y-8" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Example 4-1

A liquid crystal display device 10 for Example 4-1 was obtained in the same manner as Example 1-1, except that the anisotropic conductive film for circuit connection 16 had a thickness h3 of 6 μm ("ANISOLM: AC-11000Y-6" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 4-2

A liquid crystal display device 10 for Example 4-2 was obtained in the same manner as Example 1-1, except that the anisotropic conductive film for circuit connection 16 had a thickness h3 of 6 μm ("ANISOLM: AC-11000Y-6" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Example 5-1

First, a circuit member 12 was prepared having ITO circuit electrodes 12b (film thickness: h1=50 nm, surface resistance: <20Ω) formed on the surface of a glass substrate 12a (thickness: 1.1 mm). The line widths of the circuit electrodes 12b were 25 μm and the pitch was 50 μm.

There was also prepared a flexible wiring board 14 having Sn-plated Cu foil circuit electrodes 14b (thickness: h2=12 μm) formed on the surface of a polyimide film base 14a (thickness: 38 μm). The line widths of the circuit electrodes 14b were 18 μm and the pitch was 50 μm. Also, a solder resist 18 ("SN-9000" solder resist by Hitachi Chemical Co., Ltd.) was provided as a protecting member to protect the circuit electrodes 14b, on the sections of the circuit electrodes 14b other than the sections that are connected to the circuit electrodes 12b. The thickness of the solder resist 18 was 30 μm and the width was 10 mm.

There was additionally prepared an anisotropic conductive film for circuit connection 16 with a thickness h3 of 12 μm ("ANISOLM: AC-7206U-12" anisotropic conductive film by Hitachi Chemical Co., Ltd.).

The circuit member 12 and flexible wiring board 14 were positioned at a circuit bonding width of 1.5 mm and the anisotropic conductive film for circuit connection 16 was sandwiched by the circuit member 12 and flexible wiring board 14 and hot pressed at 180° C., 3 MPa for 15 seconds to obtain a liquid crystal display device 10 for Example 5-1. The anisotropic conductive film for circuit connection 16 and solder resist 18 had an overlap of 0.5 mm.

Example 5-2

A liquid crystal display device 10 for Example 5-2 was obtained in the same manner as Example 5-1, except that the anisotropic conductive film for circuit connection 16 was sandwiched by the circuit member 12 and flexible wiring board 14 and hot pressed at 210° C., 3 MPa for 15 seconds.

Example 6-1

A liquid crystal display device 10 for Example 6-1 was obtained in the same manner as Example 5-1, except that the anisotropic conductive film for circuit connection 16 had a thickness h3 of 8 μm ("ANISOLM: AC-7206U-8" anisotropic conductive film by Hitachi Chemical Co., Ltd.).

Example 6-2

A liquid crystal display device 10 for Example 6-2 was obtained in the same manner as Example 5-1, except that the anisotropic conductive film for circuit connection 16 had a thickness h3 of 8 μm ("ANISOLM: AC-7206U-8" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Example 7-1

A liquid crystal display device 10 for Example 7-1 was obtained in the same manner as Example 5-1, except that the anisotropic conductive film for circuit connection 16 had a thickness h3 of 12 μm ("ANISOLM: AC-11000Y-12" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 7-2

A liquid crystal display device 10 for Example 7-2 was obtained in the same manner as Example 5-1, except that the anisotropic conductive film for circuit connection 16 had a thickness h3 of 12 μm ("ANISOLM: AC-11000Y-12" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Example 8-1

A liquid crystal display device 10 for Example 8-1 was obtained in the same manner as Example 5-1, except that the anisotropic conductive film for circuit connection 16 had a thickness h3 of 8 μm ("ANISOLM: AC-11000Y-8" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 8-2

A liquid crystal display device 10 for Example 8-2 was obtained in the same manner as Example 5-1, except that the anisotropic conductive film for circuit connection 16 had a thickness h3 of 8 μm ("ANISOLM: AC-11000Y-8" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Example 9-1

A liquid crystal display device 10 for Example 9-1 was obtained in the same manner as Example 1-1, except that the anisotropic conductive film for circuit connection 16 had a thickness h3 of 3 μm ("ANISOLM: AC-7206U-3" anisotropic conductive film by Hitachi Chemical Co., Ltd.).

Example 9-2

A liquid crystal display device 10 for Example 9-2 was obtained in the same manner as Example 1-1, except that the anisotropic conductive film for circuit connection 16 had a thickness h3 of 3 μm ("ANISOLM: AC-7206U-3" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Example 10-1

A liquid crystal display device 10 for Example 10-1 was obtained in the same manner as Example 1-1, except that the anisotropic conductive film for circuit connection 16 had a thickness h3 of 3 μm ("ANISOLM: AC-11000Y-3" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 10-2

A liquid crystal display device 10 for Example 10-2 was obtained in the same manner as Example 1-1, except that the anisotropic conductive film for circuit connection 16 had a thickness h3 of 3 μm ("ANISOLM: AC-11000Y-3" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Example 11-1

A liquid crystal display device 10 for Example 11-1 was obtained in the same manner as Example 1-1, except that the anisotropic conductive film for circuit connection 16 had a thickness h3 of 4 μm ("ANISOLM: AC-7206U-4" anisotropic conductive film by Hitachi Chemical Co., Ltd.).

Example 11-2

A liquid crystal display device 10 for Example 11-2 was obtained in the same manner as Example 1-1, except that the anisotropic conductive film for circuit connection 16 had a thickness h3 of 4 μm ("ANISOLM: AC-7206U-4" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Example 12-1

A liquid crystal display device 10 for Example 12-1 was obtained in the same manner as Example 1-1, except that the anisotropic conductive film for circuit connection 16 had a thickness h3 of 4 μm ("ANISOLM: AC-11000Y-14" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Example 12-2

A liquid crystal display device 10 for Example 12-2 was obtained in the same manner as Example 1-1, except that the anisotropic conductive film for circuit connection 16 had a thickness h3 of 14 μm ("ANISOLM: AC-11000Y-14" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Comparative Example 1-1

A liquid crystal display device for Comparative Example 1-1 was obtained in the same manner as Example 1-1, except that the anisotropic conductive film for circuit connection 16 had a thickness h3 of 12 μm ("ANISOLM: AC-7206U-12" anisotropic conductive film by Hitachi Chemical Co., Ltd.).

Comparative Example 1-2

A liquid crystal display device for Comparative Example 1-2 was obtained in the same manner as Example 1-1, except that the anisotropic conductive film for circuit connection 16 had a thickness h3 of 12 μm ("ANISOLM: AC-7206U-12" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Comparative Example 2-1

A liquid crystal display device for Comparative Example 2-1 was obtained in the same manner as Example 1-1, except that the anisotropic conductive film for circuit connection 16 had a thickness h3 of 12 μm ("ANISOLM: AC-11000Y-12" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Comparative Example 2-2

A liquid crystal display device for Comparative Example 2-2 was obtained in the same manner as Example 1-1, except that the anisotropic conductive film for circuit connection 16 had a thickness h3 of 12 μm ("ANISOLM: AC-11000Y-12" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

Comparative Example 3-1

A liquid crystal display device for Comparative Example 3-1 was obtained in the same manner as Example 1-1, except that the anisotropic conductive film for circuit connection 16 had a thickness h3 of 14 μm ("ANISOLM: AC-7206U-14" anisotropic conductive film by Hitachi Chemical Co., Ltd.).

Comparative Example 3-2

A liquid crystal display device for Comparative Example 3-2 was obtained in the same manner as Example 1-1, except that the anisotropic conductive film for circuit connection 16 had a thickness h3 of 14 μm ("ANISOLM: AC-7206U-14" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 15 seconds.

Comparative Example 4-1

A liquid crystal display device for Comparative Example 4-1 was obtained in the same manner as Example 1-1, except that the anisotropic conductive film for circuit connection 16 had a thickness h3 of 4 μm ("ANISOLM: AC-11000Y-4" anisotropic conductive film by Hitachi Chemical Co., Ltd.), and the anisotropic conductive film for circuit connection 16 was sandwiched by the circuit member 12 and flexible wiring board 14 and hot pressed at 180° C., 3 MPa for 5 seconds.

Comparative Example 4-2

A liquid crystal display device for Comparative Example 4-2 was obtained in the same manner as Example 1-1, except that the anisotropic conductive film for circuit connection 16 had a thickness h3 of 4 μm ("ANISOLM: AC-11000Y-4" anisotropic conductive film by Hitachi Chemical Co., Ltd.), and the anisotropic conductive film for circuit connection 16 was sandwiched by the circuit member 12 and flexible wiring board 14 and hot pressed at 210° C., 3 MPa for 5 seconds.

(Measurement of Connection Resistance Value)

Figure 4:
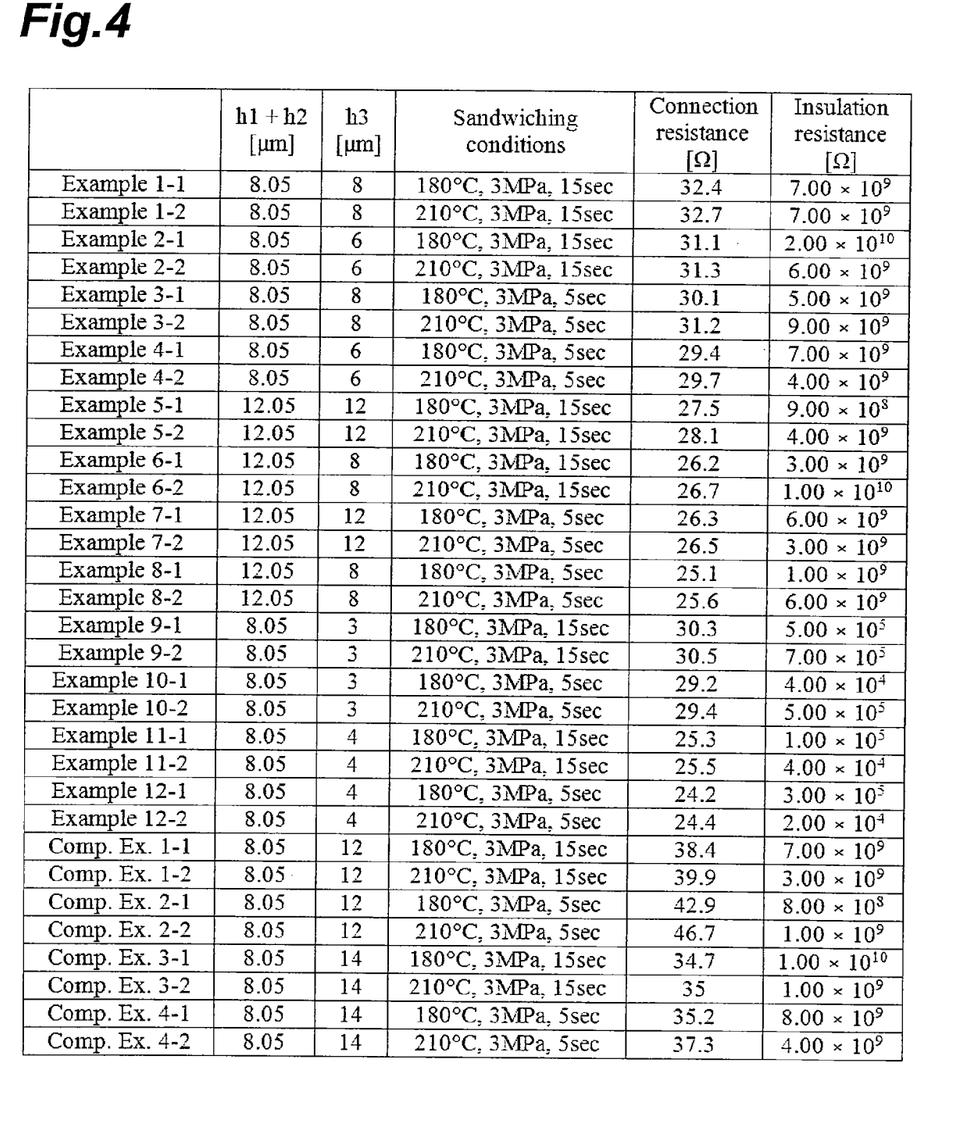
FIG. 4 is a table showing the conditions, and connection resistance and insulation resistance values for Example 1-1 to 12-2 and Comparative Example 1-1 to 4-2.

For the liquid crystal display device 10 of each of Examples 1-1 to 12-2 and the liquid crystal display device of each of Comparative Examples 1-1 to 4-2, obtained as described above, the connection resistance value between the circuit electrodes 12b and 14b was measured using a Digital Multimeter. The results of the connection resistance measurement are shown in FIG. 4.

(Measurement of Insulation Resistance Between Adjacent Circuits)

For the liquid crystal display device 10 of each of Examples 1-1 to 12-2 and the liquid crystal display device of each of Comparative Examples 1-1 to 4-2, obtained as described above, the insulation resistance between adjacent electrodes among the circuit electrodes 12b and between adjacent electrodes among the circuit electrodes 14b were measured with an insulation resistance meter 500 hours after high-temperature, high-humidity test treatment at 85° C./85% RH. The results of the insulation resistance measurement are shown in FIG. 4.

(Evaluation Results)

In Examples 1-1 to 4-2, the connection resistance values were all 30±2Ω and the insulation resistance values were all $10^8 \Omega$ or greater. In Examples 5-1 to 8-2, the connection resistance values were all no greater than 30Ω and the insulation resistance values were all $10^8 \Omega$ or greater. In Examples 9-1 and 9-2, the connection resistance values were both 30±2Ω and the insulation resistance values were both on the order of $10^5 \Omega$. In Examples 10-1 to 12-2, the connection resistance values were all no greater than 30Ω and the insulation resistance values were all on the order of $10^4$-$10^5 \Omega$.

In Comparative Examples 1-1 to 4-2, however, the connection resistance values were all no less than $10^8 \Omega$ while the insulation resistance values were all 35Ω or greater.

With the liquid crystal display devices 10 of Examples 1-1 to 8-2, the connection resistance between the circuit electrodes 12b and 14b was sufficiently low and the insulation resistance between adjacent electrodes among the circuit electrodes 12b and between adjacent electrodes among the circuit electrodes 14b was sufficiently high, even 500 hours after the high-temperature, high-humidity test treatment, thus confirming that long-term reliability was assured. With the liquid crystal display devices 10 of Examples 9-1 to 12-2, the connection resistance between the circuit electrodes 12b and 14b was sufficiently low, but the insulation resistance between adjacent electrodes among the circuit electrodes 12b and between adjacent electrodes among the circuit electrodes 14b was too low 500 hours after the high-temperature, high-humidity test treatment, thus confirming that the long-term reliability was inferior.

The invention claimed is:

1. A circuit connecting method comprising the steps of:
   (a) preparing a first circuit member having first circuit electrodes formed on a main surface of a first boards;
   (b) preparing a second circuit member having second circuit electrodes formed on a main surface of a second board, wherein an insulating layer is provided on first sections of the second circuit electrodes other than second sections that are connected to the first circuit electrodes; and
   (c) positioning an anisotropic conductive film so that part of the anisotropic conductive film overlaps part of the insulating layer, and bonding the first circuit member and the second circuit member via the anisotropic conductive film to form a circuit connection forming an electrical connection between the first circuit electrodes and the second circuit electrodes,
   wherein a thickness of the anisotropic conductive film prior to bonding is no greater than the total of the height of the first circuit electrodes and the height of the second circuit electrodes.

2. The circuit connecting method according to claim 1, wherein the thickness of the anisotropic conductive film prior to bonding is no greater than 70% of the total of the height of the first circuit electrodes and the height of the second circuit electrodes.

3. The circuit connecting method according to claim 1, wherein the thickness of the anisotropic conductive film prior to bonding is at least 50% of the total of the height of the first circuit electrodes and the height of the second circuit electrodes.

4. The circuit connecting method according to claim 1, wherein at least one of the first circuit member and the second circuit member is a flexible wiring board.

5. The circuit connecting method according to claim 1, wherein the material of the first board is glass, and the second circuit member is a flexible wiring board.

6. A circuit connecting structure obtainable by the circuit connecting method according to claim 1.

7. A method of manufacturing a circuit connecting structure in which the circuit connecting method according to claim 1 is applied.

8. The circuit connecting method according to claim 2, wherein the thickness of the anisotropic conductive film prior to bonding is at least 50% of the total of the height of the first circuit electrodes and the height of the second circuit electrodes.

9. The circuit connecting method according to claim 2, wherein at least one of the first circuit member and the second circuit member is a flexible wiring board.

10. The circuit connecting method according to claim 3, wherein at least one of the first circuit member and the second circuit member is a flexible wiring board.

11. The circuit connecting method according to claim 2, wherein the material of the first board is glass, and the second circuit member is a flexible wiring board.

12. The circuit connecting method according to claim 3, wherein the material of the first board is glass, and the second circuit member is a flexible wiring board.

* * * * *